United States Patent
Ramet et al.

(10) Patent No.: US 10,359,800 B2
(45) Date of Patent: Jul. 23, 2019

(54) BIASING CURRENT REGULARIZATION LOOP STABILIZATION

(71) Applicants: STMicroelectronics (Alps) SAS, Grenoble (FR); STMicroelectronics (Grenoble 2) SAS, Grenoble (FR)

(72) Inventors: Serge Ramet, Jarrie (FR); Sandrine Nicolas, Saint Egreve (FR); Danika Perrin, Jarrie (FR); Cedric Rechatin, Sassenage (FR)

(73) Assignees: STMicroelectronics (Grenoble 2) SAS, Grenoble (FR); STMicroelectronics (Alps) SAS, Grenoble (FR)

( * ) Notice: Subject to any disclaimer, the term of this patent is extended or adjusted under 35 U.S.C. 154(b) by 44 days.

(21) Appl. No.: 15/693,214

(22) Filed: Aug. 31, 2017

(65) Prior Publication Data
US 2018/0239384 A1     Aug. 23, 2018

(30) Foreign Application Priority Data

Feb. 17, 2017 (FR) ..................... 17 51294

(51) Int. Cl.
*G05F 1/10* (2006.01)
*G05F 3/02* (2006.01)
(Continued)

(52) U.S. Cl.
CPC ............. *G05F 3/262* (2013.01); *G05F 1/46* (2013.01); *H03F 3/16* (2013.01); *H03F 3/195* (2013.01); *H03F 2200/294* (2013.01)

(58) Field of Classification Search
CPC .......... G05F 3/262; G05F 3/242; G05F 3/205; G05F 3/247; G05F 3/245; H03F 1/302;
(Continued)

(56) References Cited

U.S. PATENT DOCUMENTS

| | | | | |
|---|---|---|---|---|
| 5,831,473 A | * | 11/1998 | Ishii | .................. G05F 3/265 327/530 |
| 2004/0164790 A1 | * | 8/2004 | Moon | ..................... G05F 3/205 327/546 |

(Continued)

FOREIGN PATENT DOCUMENTS

| EP | 0738038 A1 | 10/1996 |
|---|---|---|
| WO | 2014028667 A1 | 2/2014 |

OTHER PUBLICATIONS

Crescentini, M. et. al., "A High Resolution Interface from Kelvin Impedance Sensing", IEEE Journal of Solid-State Circuits, vol. 49, No. 10, Oct. 2014, 14 pages.

*Primary Examiner* — Anh Q Tra
(74) *Attorney, Agent, or Firm* — Slater Matsil, LLP

(57) ABSTRACT

An integrated circuit includes a first stage configured to receive a bias current. A current regulation loop includes a transimpedance amplifier having a first transistor, and a second transistor having a gate coupled to a gate of the first transistor. The first transistor and the second transistor are configured to compare the bias current with a reference current, and to generate a regulation voltage on an output node of the transimpedance amplifier. A capacitor is coupled between the output node of the transimpedance amplifier and the gates of the first and second transistors.

22 Claims, 4 Drawing Sheets

(51) Int. Cl.
*G05F 3/26* (2006.01)
*H03F 3/195* (2006.01)
*G05F 1/46* (2006.01)
*H03F 3/16* (2006.01)

(58) Field of Classification Search
CPC .... H03F 2200/18; H03F 1/301; H03F 1/0261; H03F 1/30
USPC .................. 327/538, 540, 541, 543; 330/296
See application file for complete search history.

(56) References Cited

U.S. PATENT DOCUMENTS

2006/0220731 A1* 10/2006 Taylor ..................... G05F 3/205
 327/543
2009/0040804 A1* 2/2009 Mori ....................... G11C 17/16
 365/96
2011/0216468 A1* 9/2011 Easwaran ............... F42B 3/121
 361/247
2015/0340995 A1 11/2015 Story et al.

* cited by examiner

BIASING CURRENT REGULARIZATION LOOP STABILIZATION

CROSS-REFERENCE TO RELATED APPLICATIONS

This application claims priority to French Patent Application No. 1751294, filed on Feb. 17, 2017, which application is hereby incorporated herein by reference.

TECHNICAL FIELD

Embodiments of the invention relate generally to integrated circuits and, in particular embodiments, to biasing current regularization.

BACKGROUND

Some integrated circuit devices need a constant bias current, for example, in order to place a component under conditions that are advantageous for the operation thereof.

One conventional solution for setting a bias current consists in using a current mirror. However, in some applications, for example, when gate lengths must be kept to a minimum, it is not possible to use this type of mirror due to problems matching the components of the circuit.

Moreover, the bias current must be regulated. That is to say, for example, controlled by negative feedback in order to prevent variations in its value stemming from external causes and in order to ensure a precise bias current.

Bias current regulation loops BCL0, as shown, for example, by FIGS. 1 and 2, enabling a regulated current to be passed through the device have, therefore, been produced.

In FIG. 1, the regulation loop BCL0, which regulates the bias current IDC flowing through a stage to be regulated REG0, includes a transimpedance amplifier AMP0 configured to compare the bias current IDC with a reference current Iref.

It will be recalled here that a transimpedance amplifier makes it possible, in a standard and known manner, to generate on its output a voltage signal from a current signal (for example a current variation or differential) at its input.

The amplifier AMP0 generates a regulation voltage on an output node A0. Such regulation voltage controls the conduction of a transistor T1 channelling the bias current IDC across its conduction terminals.

FIG. 2 shows the integrated circuit CI from FIG. 1, and details an example of a transimpedance amplifier AMP0.

The amplifier AMP0 includes two transistors T2, T3, which are P-MOS transistors in this example, connected into a differential pair, which make it possible to compare the bias current IDC with the reference current Iref.

The ratio of the resistances of the resistors R2 and R3 makes it possible to compare values of the bias current IDC and of the reference current Iref in accordance with the same ratio.

The reference current Iref is transmitted to the drains of the transistors T2 and T3 by a current mirror MIR including three transistors T4, T5, T6, which are N-MOS transistors in this example. The transistor T6 is diode-connected, and the two transistors T4 and T5 pass a copy of the reference current Iref to each of the two transistors T2 and T3, respectively.

A regulation loop BCL0 of this kind, the implementation of which can be likened to control of the current by negative feedback, generally requires its operation to be stabilized in order to prevent detrimental resonance effects in particular.

The phase margin reflects the stability of a system, and is equal to the difference between a phase shifted by 180° and the phase of the system at the zero-gain frequency. One conventional criterion for stability is a phase margin of greater than 45°.

The conventional solution consists in providing a stabilizing capacitor C0 connected between the output node A0 and a ground terminal GND. With $R_{A0}$ being the equivalent impedance on the output node A0, the capacitor C0 introduces a cut-off frequency at $1/2\pi R_{A0}C0$.

In a system including a regulation loop, instability is linked to the position of the unity-gain frequency (set by the dominant pole $1/2\pi R_{A0}C0$) with respect to the secondary poles. When the secondary poles are set, increasing C0 makes it possible to decrease the unity-gain frequency and thus to increase the phase margin.

With this kind of assembly, the value of the capacitor C0 may be very high.

By way of illustration, the size of such a capacitor C0 on its own may be greater than the area taken up by the entire remainder of the circuit shown in FIGS. 1 and 2. Furthermore, a large capacitance in a radiofrequency amplifier may also have an antenna effect that is detrimental to the correct operation of the latter.

Another way of stabilizing the regulation loop BCL0 may consist in decreasing the transconductance of the transistor T2, this moreover introducing a loss of precision, which is likewise undesirable.

Moreover, a capacitor coupled, for example, between the gate and the drain of the transistor T1 introduces a Miller effect that makes it possible to stabilize the regulation of the current in a more compact manner.

That being said, although the Miller effect makes it possible to ensure good current regulation loop stability, in particular, due to the effect of pole splitting, it introduces constraints that are incompatible with the use of the transistor T1 as a radiofrequency amplifier, since it limits the bandwidth of the transistor T1.

Therefore, there is a need to stabilize a current regulation loop without impairing its performance while not limiting the bandwidth of the stage to be regulated and in a way that minimizes the area taken up in the integrated circuit.

SUMMARY

Embodiments of the invention relate generally to integrated circuits and, in particular embodiments, to current regulation loops. More specifically, embodiments of the invention relate to regulation of static currents (e.g. currents having a constant level) such as amplifier bias currents.

According to one aspect, an integrated circuit comprises a stage to be regulated through which a current, such as a static current, for example an amplifier bias current, is able to flow, and a current regulation loop. The regulation loop comprises a transimpedance amplifier including a common gate first transistor and second transistor that are configured to compare the current passing through the stage to be regulated with a reference current and to generate a regulation voltage on an output node of the transimpedance amplifier. The integrated circuit furthermore comprises a capacitor coupled between the output node and the gates of the first and second transistors.

The capacitor coupled between the output node and the gates of the first and second transistors, which capacitor is advantageously a stabilizing capacitor, makes it possible to implement stabilization of the current regulation loop in accordance with an advantageous band-pass capacitance multiplication effect.

This effect has the advantage of amplifying the capacitance of the capacitor, and makes it possible to minimize the size of this capacitor. For example, this effect makes it possible to reduce the size of a capacitor C0 of the kind described with reference to FIGS. 1 and 2 by more than 90%, for a better result.

Thus, the capacitance of the capacitor is advantageously less than 5 picofarads.

The band-pass capacitance multiplication effect makes it possible to choose the frequencies for which the stabilization is implemented, in order not to impair the performance of the stage to be regulated.

The current regulation loop may, therefore, be configured to have a bandwidth that is lower by at least a factor of ten than the working frequency of the stage to be regulated.

For example, the current regulation loop is configured to regulate the static current with a cut-off at several tens of megahertz, i.e., a frequency that is far from the operating frequency, which is greater than 1 gigahertz, of the stage to be regulated.

The stabilization of the regulation according to this aspect makes it possible to decrease the size of integrated circuits intended in particular for radiofrequency communications, and in accordance with optimum operation.

The stage to be regulated may, therefore, include a radiofrequency amplifier having a working frequency of greater than 1 gigahertz.

For example, the radiofrequency amplifier is a low-noise amplifier including an amplification transistor, the gate of which is connected to the output node of the transimpedance amplifier by a resistor.

In another example, the radiofrequency amplifier is an NMOS-PMOS dual amplifier including two amplification transistors, the gate of one of the amplification transistors being connected to the output node of the transimpedance amplifier by a resistor.

For example, in the current regulation loop, the gates of the first and second transistors are connected to the drain of the second transistor, the two transistors being configured to pass the reference current, and the output node of the transimpedance amplifier is connected to the drain of the first transistor.

Moreover, the transimpedance amplifier may include a reference current source, and a current mirror configured to pass copies of the reference current to the drains of the first and second transistors, respectively.

The current regulation loop may include a first resistor and a second resistor that are connected between a terminal configured to receive a supply voltage and the source of the first transistor and the source of the second transistor, respectively.

BRIEF DESCRIPTION OF THE DRAWINGS

Other advantages and features of the invention will become apparent upon examination of the detailed description of non-limiting embodiments and of the appended drawings, in which.

Below, the resistances of the resistors and the capacitances of the capacitors of a circuit will be referenced indiscriminately using the same reference (e.g. R or C).

DETAILED DESCRIPTION OF ILLUSTRATIVE EMBODIMENTS

Figure 3:
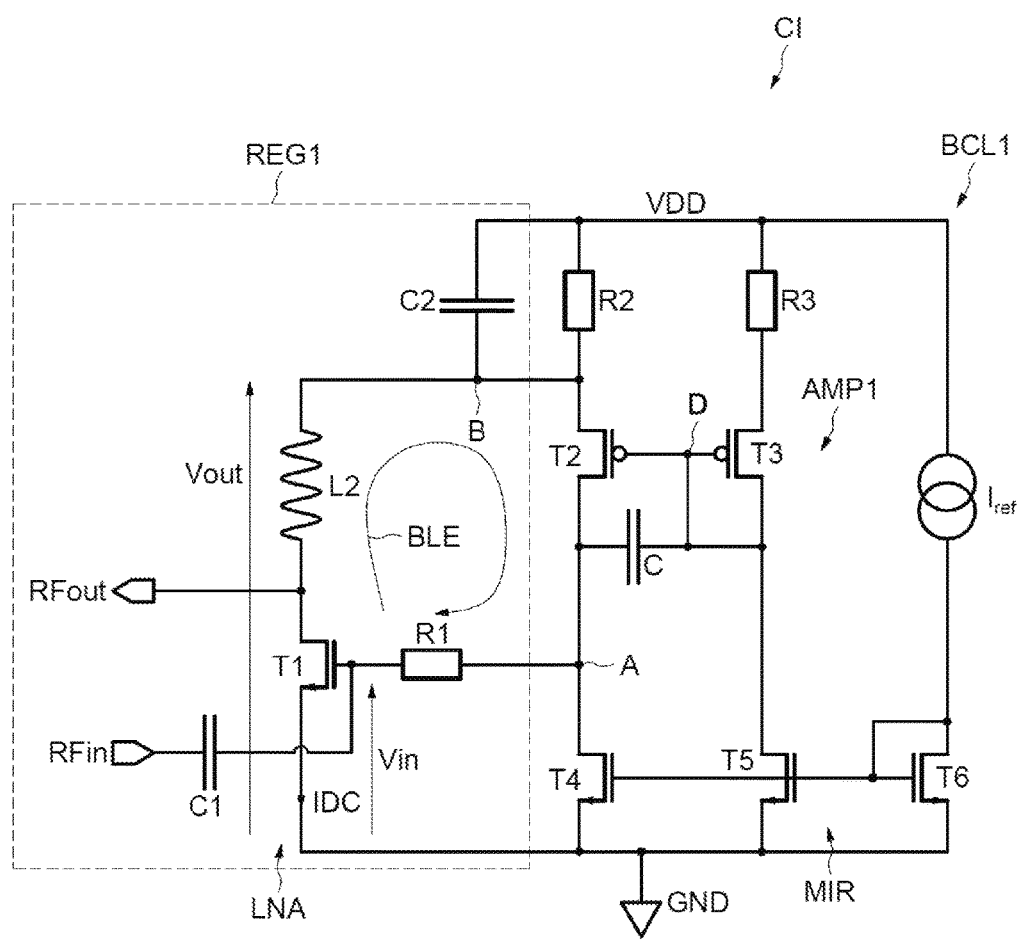
FIGS. 3 and 5 show advantageous exemplary embodiments of the invention.

FIG. 3 shows an example of an integrated circuit CI including a stage to be regulated REG1, as well as a regulation loop BCL1 that is advantageously stabilized.

In this example, the stage to be regulated REG1 includes a low-noise amplifier LNA, configured to amplify radiofrequency signals having frequencies of greater than 1 gigahertz, for example.

The amplifier LNA includes an amplification transistor T1, an input terminal RFin coupled to the gate of the amplification transistor T1 by a capacitor C1, and an output terminal RFout coupled to the drain of the amplification transistor T1.

The source of the amplification transistor T1 is connected to a ground terminal GND.

Although not shown in FIG. 3, a cascode transistor for input-output isolation could be connected in series between the amplification transistor T1 and the output terminal, while being controlled by a cascode reference voltage on its gate.

A capacitor C1 and a resistor R1 form a filter that isolates the input terminal RFin from potential signals having frequencies of lower than 1 gigahertz in this example.

A resonator loading the transistor T1 comprises an inductive load L2 connected in series with a capacitor C2, which capacitor itself is in parallel with a resistor R2, between the drain of the amplification transistor T1 and a terminal configured to receive a supply voltage VDD.

The inductive load L2 makes it possible to increase the output dynamic range of the low-noise amplifier LNA and the capacitor C2 makes it possible to prevent a drop in the quality factor of the resonator loading the transistor T1.

A low-noise amplifier LNA assembly of this kind requires a bias current IDC to flow through the conduction terminals of the transistor T1 in order for the amplification transistor T1 to be placed in a linear regime that is optimal with regard to amplification.

The constant (or low-frequency) component of the voltage present on the gate of the amplification transistor T1 makes it possible to control this flow of bias current IDC.

The bias current regulation loop BCL1 makes it possible to control the value of the constant component of the gate voltage of the transistor T1, or in other words the regulation voltage.

The regulation loop BCL1 includes a transimpedance amplifier AMP1, including an advantageous stabilizing means.

The transimpedance amplifier AMP1 includes a current mirror MIR comprising a diode-connected NMOS transistor T6, the gate voltage of which controls two copy NMOS transistors T4, T5.

The current mirror MIR is configured to pass copies of a reference current IREF generated by a current source to the drain of a first PMOS transistor T2 and the drain of a second PMOS transistor T3, respectively.

The first transistor T2 and the second transistor T3 are common gate transistors, the gate being connected to the drain of the second transistor T3.

A resistor R2 is connected on the one hand to the source of the first transistor T2 and on the other hand to a supply voltage terminal VDD, and, likewise, a resistor R3 is connected on the one hand to the source of the second transistor T3 and on the other hand to the supply terminal VDD.

This configuration makes it possible to compare the currents flowing through the sources of each of the first and second transistors, in accordance with a comparison factor equal to the ratio between the resistances of the resistors R2 and R3.

Moreover, various size ratios between the transistors of the current mirror MIR and the common gate transistors T2, T3 also make it possible to dimension the comparison factor of the currents.

For the sake of simplification, it will hereinafter be considered that the comparison factor is equal to one.

An output node A of the transimpedance amplifier is connected to the drain of the first transistor T2.

A regulation voltage reflecting a difference between the current flowing through the first transistor T2 and the reference current IREF is delivered to the output node A, the gate of the amplification transistor T1 being connected to the latter by means of a resistor R1 termed the isolation resistor.

The regulation voltage present on the output node A consequently controls the transistor T1 into a more or less conductive state, and regulates the magnitude of the bias current IDC until an equilibrium is reached.

Equilibrium is reached when the current IDC satisfies the equation: $R2*(I_{T2}+IDC)=R3*I_{T3}$, with $I_{T2}$ the current flowing through the first transistor T2 and $I_{T3}$ the current flowing through the second transistor T3.

The PMOS transistors T2, T3 and NMOS transistors T4, T5, T6 of the regulation loop BCL1 are dimensioned in such a way as to obtain good matching of the currents and sufficient gain in the transimpedance amplifier AMP1.

Furthermore, a capacitor C is coupled on the one hand to the drain of the first transistor T2 and on the other hand to the gates of the first and of the second transistors T2, T3. This capacitor C makes it possible to stabilize the regulation implemented by the loop BCL1.

Figure 4:
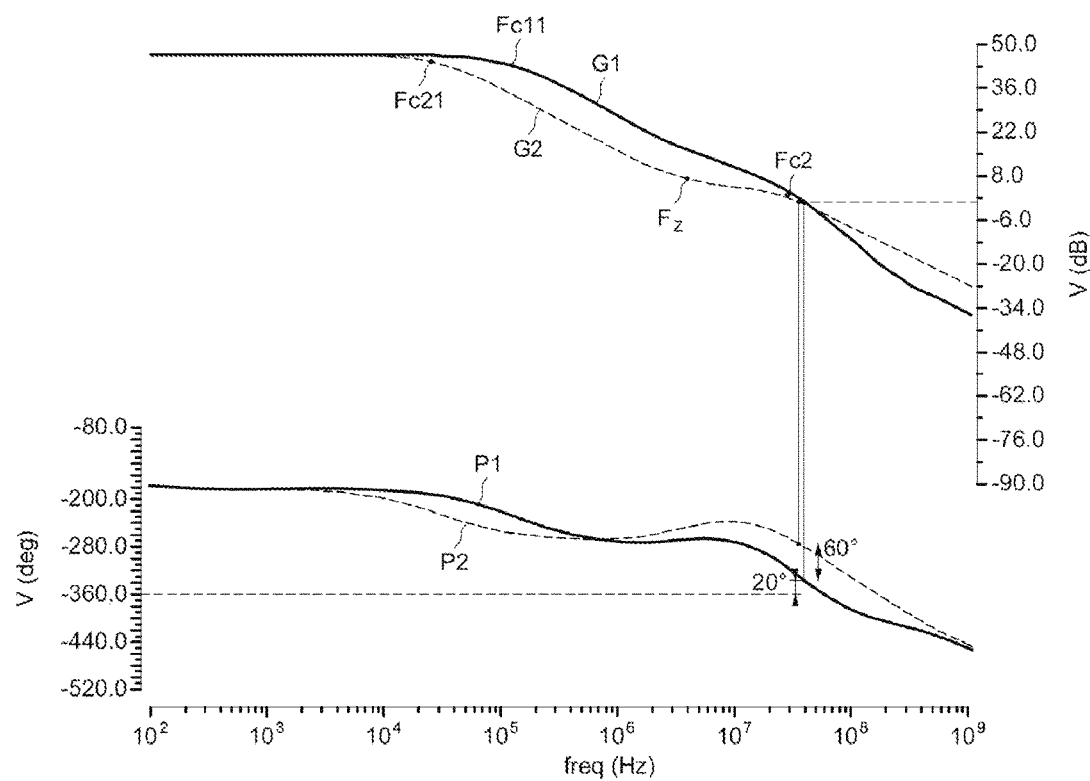
FIG. 4 is a plot showing a band-pass capacitance multiplication effect according to one exemplary embodiment of the invention.

FIG. 4 shows a Bode plot describing the transfer function of an open loop BLE on the gate of the transistor T1 and comprising the transistor T1, the inductive load L2, the transistor T2 and the resistor R1, in the configuration described with reference to FIG. 3 and in a conventional configuration of the kind described with reference to FIG. 2.

The curves G1 and P1 respectively represent the gain and the phase of the frequency response of an open loop equivalent to the loop BLE for a configuration of the kind described with reference to FIG. 2, in particular including a capacitor C0 coupled between the output node A and a ground terminal GND.

The curves G2 and P2 respectively represent the gain and the phase of the frequency response of the loop BLE in the configuration described with reference to FIG. 3, including a capacitor C coupled between the drain of the transistor T2 and the gates of transistors T2 and T3.

At low frequencies, for example, frequencies lower than 20 kHz, the transistor T2 acts as a transconductance amplifier and participates in the open-loop gain $G_{REG}$.

The gain $G_{REG}$ may be expressed by $G_{REG}=gm_{T1}*gm_{T2}*R2*R_A$, with $gm_{T1}$ the transconductance of the transistor T1, $gm_{T2}$ the transconductance of the transistor T2, and $R_A$ the equivalent impedance on the output node A.

It can furthermore be seen from the gain curves G1, G2 that the capacitor C, coupled between the drain of the transistor T2 and the common gate of transistors T2 and T3, introduces two effects in particular.

A first effect is a decrease in a first cut-off frequency.

Figure 2:
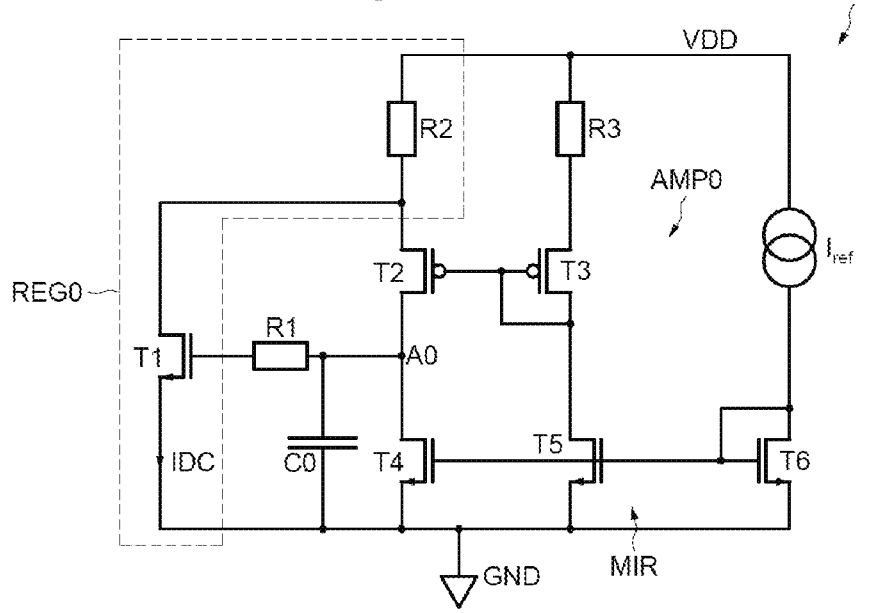

For example, a capacitor C0 that would conventionally be connected between the output node A and ground GND, as in FIG. 2, of capacitance equal to 40 pF, would introduce a first cut-off frequency Fc11 at 55 kHz; $Fc11=\frac{1}{2}\pi R_A C0$.

The capacitor C connected between the drain and the gate of the transistor T2 of the kind described with reference to FIG. 3 and of capacitance equal to 1 pF for its part introduces a first cut-off frequency Fc21 at 20 kHz.

The variations in the voltage present on the node B are transmitted to the node A, via the transistor T2 acting as a transconductance amplifier, and the variations transmitted to the node A are transmitted to the node D by the capacitor C. At the frequency Fc21, these variations are identical on nodes B and D, which causes the gain G2 to fall.

However, when the frequency increases again, a second notable effect of the capacitor C is observed.

Specifically, with the increase in the frequency, the signal at A decreases and becomes equal to the signal at D, which itself is equal to the signal at B. This parity is observed starting from a frequency Fz, termed the zero occurrence frequency, $Fz=\frac{1}{2}\pi(R_{T3}+R3)C$, with $R_{T3}$ the resistance of the transistor T3 in the on state.

The capacitance C of the capacitor C is here advantageously a capacitance that is amplified by the transconductance $gm_{T2}$ of the transistor T2.

Starting from the zero occurrence frequency Fz, the gain stops falling, which causes the phase P2 to rise, which is beneficial for stability.

Moreover, starting from a second cut-off frequency Fc2, $Fc2=\frac{1}{2}\pi R2*C2$, the filter formed by the resistor R2 and the capacitor C2 causes the voltage present on the node B, and therefore also the voltage present on the node A, to fall.

In other words, the capacitor C in this configuration makes it possible to obtain, on the one hand, a first low-frequency cut-off for a low capacitance, and makes it possible, on the other hand, to increase the phase shift at the zero-gain frequency by an effect that could be qualified a band-pass capacitance multiplication effect.

With regard to stability, it can be seen from the phase curves P1, P2 of FIG. 4 that, in the presence of the capacitor C, the phase margin increases by substantially 60° in this example.

In the absence of the capacitor C, the phase margin of the configuration in this example is around 20°, and around 80° with the loop BCL1 including the capacitor C, which bears witness to an extremely good stability (it will be recalled that the conventional criterion for good stability is a phase offset of greater than 45°).

Figure 1:
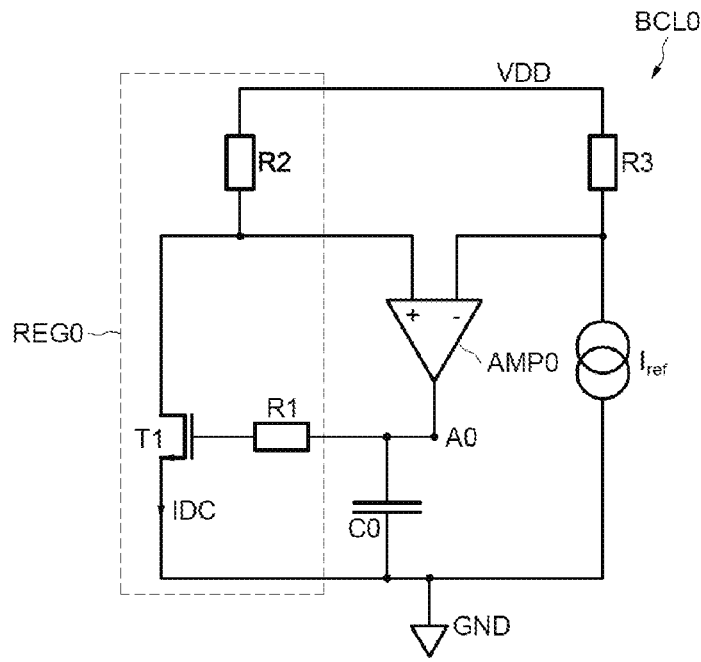
FIGS. 1 and 2, described above, show an integrated circuit including a current regulation loop stabilized using conventional means.

By way of comparison, a capacitor C0 coupled in the manner described above with reference to FIGS. 1 and 2 and having a capacitance forty times greater than the capacitor C makes it possible to obtain a phase margin of around 40°.

Thus, the band-pass capacitance multiplication effect of the capacitor C not only makes it possible to reduce the area taken up by a conventional stabilizing capacitor by more than 90%, but also ensures a better performance.

Figure 5:
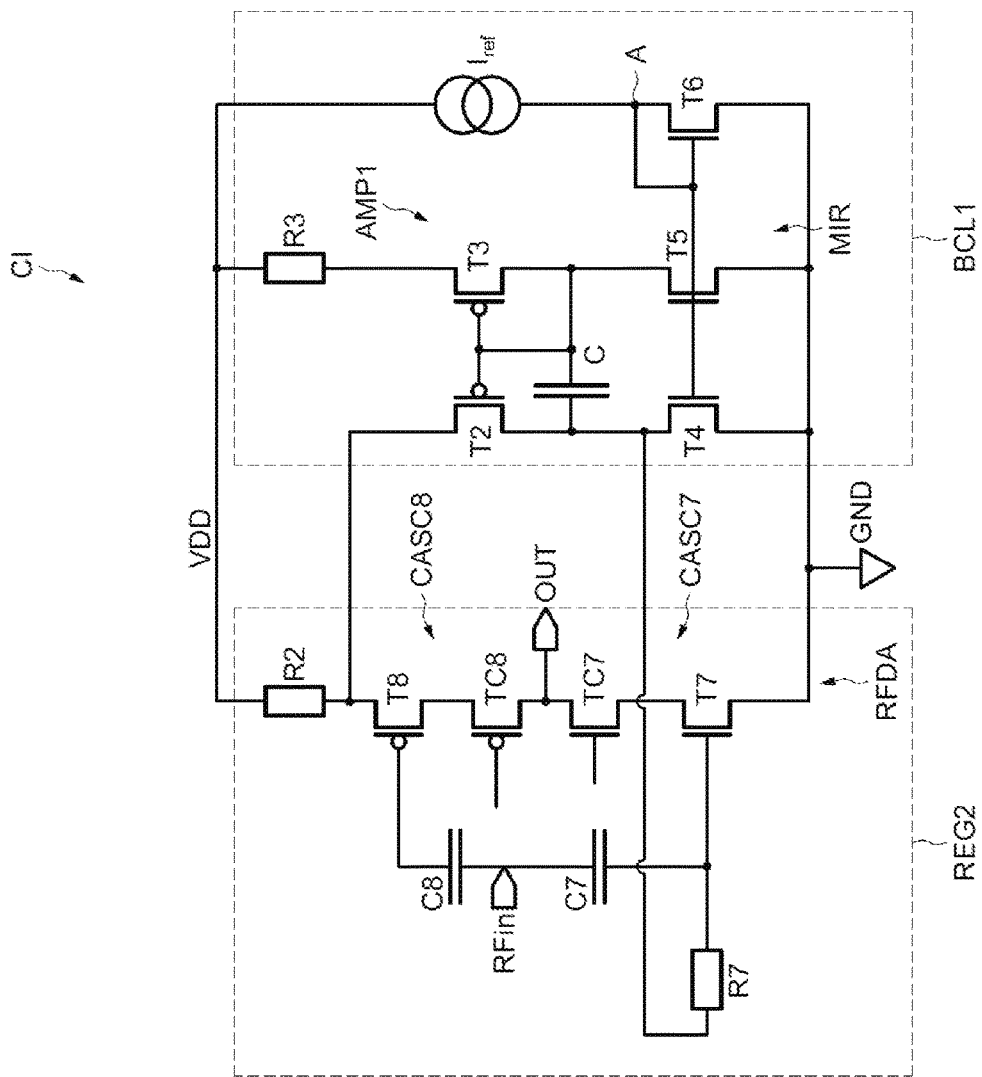

FIG. 5 shows another example of an integrated circuit CI including a stage to be regulated REG2, as well as a regulation loop BCL1 that is advantageously stabilized.

The regulation loop BCL1 has the same structure and effects as the regulation loop described above with reference to FIG. 3, and will not be detailed again here.

The stage to be regulated REG2, for its part, includes an NMOS-PMOS dual amplifier RFDA.

The stage to be regulated REG2 includes an input terminal RFin that receives a radiofrequency voltage signal, amplified by a transconductance amplification stage TRSC including two cascode amplifiers CASC7, CASC8 with a current output OUT.

The first cascode amplifier CASC7 includes a transconductance amplification N-MOS transistor T7, the gate of which is coupled to the input terminal RFin, in series with a cascode N-MOS transistor TC7, the drain of which is connected to the output OUT.

The second cascode amplifier CASC8 includes a transconductance amplification P-MOS transistor T8, the gate of which is coupled to the input terminal RFin, in series with a cascode P-MOS transistor TC8, the drain of which is connected to the output OUT.

A resistor R2 connected between a supply voltage terminal VDD and the amplification transistor T8 makes it possible to measure the bias current that passes through the cascoded amplifiers CASC7, CASC8 of the NMOS-PMOS dual amplifier RFDA and flows to a ground terminal GND.

The output node A of the current regulation loop BCL1 is connected to the gate of the transistor T7 by a resistor R7, and the regulation is implemented in a manner similar to that described in relation to FIG. 3.

Moreover, the invention is not limited to these embodiments, but encompasses all variants, for example the stages to be regulated REG1 and REG2 have been given by way of example, as have the various numerical values.

What is claimed is:

1. An integrated circuit comprising:
   a first stage configured to receive a bias current;
   a current regulation loop comprising a transimpedance amplifier that comprises a first transistor, and a second transistor having a gate coupled to a gate of the first transistor, the first transistor and the second transistor configured to compare the bias current with a reference current, and generate a regulation voltage on an output node of the transimpedance amplifier; and
   a capacitor coupled between the output node of the transimpedance amplifier and the gates of the first and second transistors, wherein the first stage comprises a radiofrequency (RF) amplifier having a working frequency of greater than 1 gigahertz, the RF amplifier comprising a low-noise amplifier (LNA) that comprises an amplification transistor having a gate coupled to the output node of the transimpedance amplifier via a first resistor.

2. The integrated circuit of claim 1, wherein the capacitor has a capacitance that is less than 5 picofarads.

3. The integrated circuit of claim 1, wherein the bias current is configured to have a bandwidth that is lower by at least a factor of ten than a working frequency of the first stage.

4. An integrated circuit comprising:
   a first stage configured to receive a bias current;
   a current regulation loop comprising a transimpedance amplifier that comprises a first transistor, and a second transistor having a gate coupled to a gate of the first transistor, the first transistor and the second transistor configured to compare the bias current with a reference current, and generate a regulation voltage on an output node of the transimpedance amplifier; and
   a capacitor coupled between the output node of the transimpedance amplifier and the gates of the first and second transistors, wherein the first stage comprises a radiofrequency (RF) amplifier having a working frequency of greater than 1 gigahertz, wherein the RF amplifier comprises an NMOS-PMOS dual amplifier comprising a first and second amplification transistors; and wherein a gate of the first amplification transistor is coupled to the output node of the transimpedance amplifier via a second resistor.

5. The integrated circuit of claim 1, wherein:
   the gates of the first and second transistors are coupled to a drain of the second transistor;
   the first and second transistors being configured to pass the reference current; and
   the output node of the transimpedance amplifier is coupled to a drain of the first transistor.

6. The integrated circuit of claim 1, wherein the transimpedance amplifier comprises:
   a reference current source; and
   a current mirror configured to pass copies of the reference current to drains of the first and second transistors.

7. The integrated circuit of claim 1, wherein the current regulation loop comprises:
   a third resistor coupled between a supply terminal configured to receive a supply voltage and a source of the first transistor; and
   a fourth resistor coupled between the supply terminal and a source of the second transistor.

8. A circuit comprising:
   a first transistor having a first load path node coupled to a first supply terminal;
   a second transistor having a first load path node coupled to the first supply terminal, a gate coupled to a gate of the first transistor, and a second load path node coupled to the first load path node of the second transistor;
   a first resistor coupled between the first load path node of the first transistor and the first supply terminal;
   a second resistor coupled between the first load path node of the second transistor and the first supply terminal;
   a first capacitor coupled between a second load path terminal of the first transistor and the gate of the second transistor;
   a third transistor having a load path coupled between the second load path node of the first transistor and a second supply terminal;
   a fourth transistor having a load path coupled between the second load path node of the second transistor and the second supply terminal, and a gate coupled to a gate of the third transistor;
   a third resistor having a first terminal coupled to the second load path node of the first transistor;
   a sixth transistor having a gate coupled to a second terminal of the third resistor, a first load path node coupled to the first load path node of the first transistor via an inductive element, and a second load path node coupled to the second supply terminal; and
   a second capacitor coupled between the second load path node of the first transistor and the first supply terminal.

9. The circuit of claim 8, wherein:
   the first supply terminal is configured to receive a voltage higher than the second supply terminal, and
   the second supply terminal is coupled to a ground reference.

10. The circuit of claim 8, wherein:
    the first transistor is a p-type transistor;
    the second transistor is a p-type transistor;
    the third transistor is an n-type transistor; and
    the fourth transistor is an n-type transistor.

11. The circuit of claim 8, further comprising a fifth transistor having a load path coupled between the first supply terminal and the second supply terminal, and a gate couple to the gate of the fourth transistor.

12. The circuit of claim 11, further comprising a current source coupled between the first supply terminal and the load path of the fifth transistor.

13. The circuit of claim 8, wherein:
the gate of the sixth transistor is configured to receive a first radiofrequency (RF) signal via a third capacitor; and
the first load path node of the sixth transistor is configured to produce a second RF signal based on the first RF signal.

14. The circuit of claim 8, further comprising the inductive element.

15. A circuit comprising:
a first transistor having a first load path node coupled to a first supply terminal;
a second transistor having a first load path node coupled to the first supply terminal, a gate coupled to a gate of the first transistor, and a second load path node coupled to the first load path node of the second transistor;
a first resistor coupled between the first load path node of the first transistor and the first supply terminal;
a second resistor coupled between the first load path node of the second transistor and the first supply terminal;
a first capacitor coupled between a second load path terminal of the first transistor and the gate of the second transistor;
a third transistor having a load path coupled between the second load path node of the first transistor and a second supply terminal;
a fourth transistor having a load path coupled between the second load path node of the second transistor and the second supply terminal, and a gate coupled to a gate of the third transistor;
a third resistor having a first terminal coupled to the second load path node of the first transistor
a seventh transistor having a gate coupled to a second terminal of the third resistor, and a load path coupled between an output terminal and the second supply terminal;
an eighth transistor having a load path coupled between the first resistor and the load path of the seventh transistor;
a fourth capacitor coupled between a gate of the eighth transistor and an input terminal; and
a fifth capacitor coupled between the input terminal and the gate of the seventh transistor.

16. A method comprising:
receiving a reference current with a transimpedance amplifier comprising a first transistor and a second transistor, the first transistor having a gate coupled to a gate of the second transistor, and a drain of the first transistor being coupled to the gate of the second transistor via a first capacitor;
comparing the reference current with a bias current using the first and second transistors, the bias current con-figured to pass through a first circuit, the first circuit comprising a third transistor having a gate coupled to a first resistor;
generating a regulation voltage on an output node of the transimpedance amplifier, the output node of the transimpedance amplifier coupled to the first resistor;
receiving a first radiofrequency (RF) signal in the gate of the third transistor; and
generating a second RF signal in an output terminal based on the first RF signal.

17. The method of claim 16, wherein the bias current flows through an inductor coupled in series with a load path of the third transistor, the inductor coupled to a second capacitor.

18. A method comprising:
receiving a reference current with a transimpedance amplifier comprising a first transistor and a second transistor, the first transistor having a gate coupled to a gate of the second transistor, and a drain of the first transistor being coupled to the gate of the second transistor via a first capacitor;
comparing the reference current with a bias current using the first and second transistors, the bias current configured to pass through a first circuit, the first circuit comprising a radiofrequency (RF) amplifier having a working frequency of greater than 1 gigahertz, the RF amplifier comprising an NMOS-PMOS dual amplifier that comprises a third transistor having a gate coupled to a first resistor and a fourth transistor; and
generating a regulation voltage on an output node of the transimpedance amplifier, the output node of the transimpedance amplifier coupled to the first resistor, wherein the reference current flows through a load path of the fourth transistor; and
copying the reference current using a current mirror comprising a fifth transistor and a sixth transistor, the fifth transistor coupled between the first transistor and a reference terminal, and the sixth transistor coupled between the second transistor and the reference terminal.

19. The method of claim 18, wherein generating the regulation voltage on the output node of the transimpedance amplifier comprises generating the regulation voltage on the output node of the transimpedance amplifier without having a capacitor connected between the output node of the transimpedance amplifier and the reference terminal.

20. The integrated circuit of claim 1, wherein the current regulation loop is configured to generate the regulation voltage on the output node of the transimpedance amplifier without having a capacitor connected to the output node of the transimpedance amplifier.

21. The integrated circuit of claim 4, wherein the bias current is configured to have a bandwidth that is lower by at least a factor of ten than a working frequency of the first stage.

22. The integrated circuit of claim 4, wherein the capacitor has a capacitance that is less than 5 picofarads.

* * * * *